United States Patent
Tian et al.

(10) Patent No.: US 9,264,009 B2
(45) Date of Patent: Feb. 16, 2016

(54) AC COUPLING CIRCUIT WITH HYBRID SWITCHES AND CONSTANT LOAD

(71) Applicant: LSI Corporation, San Jose, CA (US)

(72) Inventors: Jun Tian, Shanghai (CN); Angelo R. Mastrocola, Sinking Spring, PA (US); Rodney J. Steffes, Farmington, MN (US); Douglas J. Spannring, Fort Collins, CO (US); Ming Chen, Shanghai (CN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 368 days.

(21) Appl. No.: 13/887,720

(22) Filed: May 6, 2013

(65) Prior Publication Data

US 2014/0266497 A1   Sep. 18, 2014

Related U.S. Application Data

(60) Provisional application No. 61/791,871, filed on Mar. 15, 2013.

(51) Int. Cl.
 *H03H 7/06* (2006.01)
 *H01P 1/10* (2006.01)
 *H03K 17/16* (2006.01)
 *H03K 17/687* (2006.01)

(52) U.S. Cl.
 CPC .. *H03H 7/06* (2013.01); *H01P 1/10* (2013.01); *H03K 17/165* (2013.01); *H03K 17/6871* (2013.01); *H03K 2217/0009* (2013.01)

(58) Field of Classification Search
 CPC ............ H01P 1/10; H01P 1/15; H03K 17/16; H03K 17/161; H03K 17/165; H03K 17/6871; H03K 2217/0009; H03H 7/06; H03H 19/004
 USPC .......................................... 333/101, 103, 172
 See application file for complete search history.

(56) References Cited

U.S. PATENT DOCUMENTS

| | | | |
|---|---|---|---|
| 3,603,898 A * | 9/1971 | Dawson et al. | 333/173 |
| 6,411,161 B1 | 6/2002 | Yamamoto | 330/85 |
| 7,495,318 B2 | 2/2009 | Roth et al. | 257/664 |
| 7,643,575 B2 | 1/2010 | Lewis et al. | 375/316 |
| 7,719,380 B2 | 5/2010 | Yetter et al. | 333/24 |
| 7,961,817 B2 | 6/2011 | Dong et al. | 375/317 |
| 7,965,124 B1 | 6/2011 | Shia et al. | 372/337 |
| 8,704,581 B2 | 4/2014 | Mathe | 327/337 |
| 2006/0038631 A1 | 2/2006 | Yetter et al. | 333/24 |
| 2007/0071144 A1 | 3/2007 | Lewis et al. | 375/344 |
| 2011/0176806 A1 | 7/2011 | Dvir | 398/58 |

* cited by examiner

*Primary Examiner* — Benny Lee
*Assistant Examiner* — Albens Dieujuste
(74) *Attorney, Agent, or Firm* — Suiter Swantz pc llo

(57) ABSTRACT

A coupling apparatus having plurality of branches and a resistive element is disclosed. Each branch may be configured to couple at least one of (i) a first input node and (ii) a second input node to a first output node through a plurality of switches and a plurality of capacitors. The resistive element generally connects the first output node to a second output node. The first output node may be loaded by a respective parasitic capacitance of at least one of the switches.

20 Claims, 8 Drawing Sheets

US 9,264,009 B2

AC COUPLING CIRCUIT WITH HYBRID SWITCHES AND CONSTANT LOAD

This application relates to U.S. Provisional Application No. 61/791,871, filed
Mar. 15, 2013, which is hereby incorporated by reference in its entirety.

The present application relates to co-pending U.S. application Ser. No. 13/887,665, filed May 6, 2013 now U.S. Pat. No. 8,941,433.

FIELD OF THE INVENTION

The present invention relates to integrated circuits generally and, more particularly, to a method and/or apparatus for implementing an AC coupling circuit with hybrid switches.

BACKGROUND OF THE INVENTION

Conventional AC coupling circuits (i.e., ACC) are used in hard disc drive (i.e., HDD) read channels. An ACC circuit provides adjustable attenuation ranging from several dBs to about twenty dBs. An ACC circuit also provides a high dynamic high pass filter time constant that ranges from several hundred pico-seconds to several micro-seconds. An ACC circuit should have a reasonable input bandwidth in various different working modes. Switches used in capacitor branches of a conventional ACC circuit will have an influence on the ACC performance, especially when the resistance of switches is comparable to a resistor used in the high pass filter when a short high pass filter time constant is being designed. The switches also contribute parasitic capacitances at an input node of the ACC circuit.

It would be desirable to implement an AC coupling circuit integrated with hybrid switches.

SUMMARY OF THE INVENTION

The invention concerns a coupling apparatus having plurality of branches and a resistive element. Each branch may be configured to couple at least one of (i) a first input node and (ii) a second input node to a first output node through a plurality of switches and a plurality of capacitors. The resistive element generally connects the first output node to a second output node. The first output node may be loaded by a respective parasitic capacitance of at least one of the switches.

Features and advantages of the present invention include providing a coupling circuit that may (i) provide AC coupling, (ii) provide a hybrid switch, (iii) be implemented as an integrated circuit (IC), (iv) provide a range of switching options, (v) provide variable attenuation, (vi) provide a range of a high pass filter time constants, (vii) provide a reasonable input bandwidth, (viii) provide a large input common mode range in a normal mode, (ix) be easy to compromise among multiple performance parameters and/or (x) be easy to implement.

BRIEF DESCRIPTION OF THE DRAWINGS

These and other features and advantages of the present invention will be apparent from the following detailed description and the appended claims and drawings in which:

DETAILED DESCRIPTION OF THE PREFERRED EMBODIMENTS

In a hard disc drive (e.g., HDD) receiver, an AC-coupling circuit (e.g., ACC) is often used to decouple the input signal from the input buffer. An integrated capacitor can be placed between the input node of a receiver and the input buffer. A resistive impedance element is connected to the internal high-speed data node after the capacitor.

Various switches may be implemented on either an input side or on an output node of the ACC circuit. In various embodiments of the ACC circuit, multiple (e.g., four) design specifications include (i) attenuation, (ii) a high pass filter (e.g., HPF) time constant (e.g., τ or tau), (iii) input bandwidth and/or (iv) capacitor area. Such specifications can not normally be compromised to satisfy each other. To mitigate the correlation between specifications, multiple kinds of ACC circuits with hybrid switches may be used. Some embodiments use the hybrid switches in different modes, and other embodiments use the hybrid switches in different modes and/or different capacitor branches. Depending on the performance target, a suitable design is generally implemented.

Figure 1:
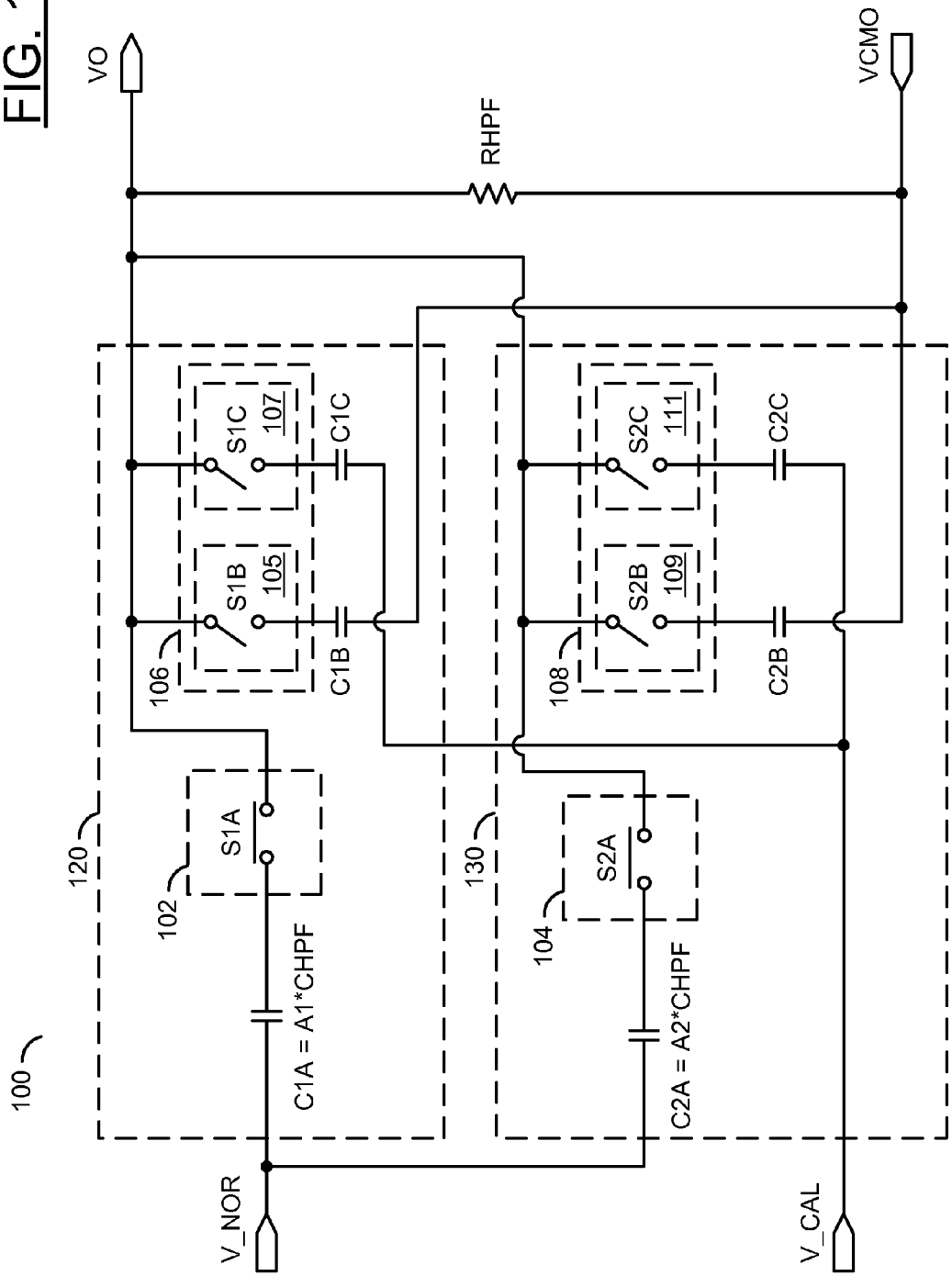
FIG. 1 is a diagram of a single-ended coupling circuit.

Referring to FIG. 1, a diagram of a circuit 100 is shown. The circuit 100 may be implemented as a single-ended AC coupling circuit. The circuit 100 generally comprises a block (or circuit) 102, a block (or circuit) 104, a block (or circuit) 106 and a block (or circuit) 108. The circuit 106 generally comprises a block (or circuit) 105 and a block (or circuit) 107. The circuit 108 generally comprises a block (or circuit) 109 and a block (or circuit) 111. The circuit 100 includes a capacitor (e.g., C1A), a capacitor (e.g., C2A), a capacitor (e.g., C1B), a capacitor (e.g., C1C), a capacitor (e.g., C2B), a capacitor (e.g., C2C) and a resistor (e.g., RHPF). An output node (e.g., VO) may be connected to the switch 102, the switch 104, the switch 106, and/or the switch 108. An input signal (e.g., V_NOR) may be presented to the output node VO through the switch 102 and/or the switch 104. A signal (e.g., V_CAL) may be presented to one side of the switch 106 through the capacitor C1C and to one side of the switch 108 through the capacitor C2C. An AC ground voltage (e.g., VCMO) may be presented to one side of the switch 106 through the capacitor C1B and to one side of the switch 108 through the capacitor C2B. A node is shown connected to the switch 102 and the switch 106. The node is shown connected to the switch 104 and the switch 108. In some embodiments, the circuit 100 may be mirrored to form a differential (or double-sided) AC coupling circuit.

The circuits 102 and 106 may be combined to form a branch (or channel) 120. The branch 120 generally provides a signal path between the input node for the signal V_NOR to the output node VO. The branch 120 includes an interface that connects to the signal V_CAL. The branch 120 also includes an interface that connects to the AC ground voltage VCMO.

The circuits 104 and 108 may be combined to form a branch (or channel) 130. The branch 130 generally provides a signal path between the input node for the signal V_NOR to the output node VO. The branch 130 includes an interface that connects to the signal V_CAL. The branch 130 also includes an interface that connects to the AC ground voltage VCMO.

To facilitate calibration, the two or more signal input paths with different input common mode voltages may be implemented. One signal path is shown as a normal operation path that receives the signal V_NOR and has common mode voltage of (V_NOR_positive+V_NOR_negative)/2 (e.g., a normal mode). The other signal path is shown as a calibration path and receives the signal V_CAL with common mode near a ground voltage (e.g., a calibration mode). To support a large input swing, the capacitors C1A and C1C are shown connected to the two signal paths. The switch 102 may be implemented as a switching element S1A (e.g., CMOS, NMOS and/or PMOS). The switch 104 may be implemented as a switching element S2A. While a single switch is shown, a compound switch may be implemented to meet the design criteria of a particular implementation. The switch 106 is shown implemented as a switching element S1B (e.g., the circuit 105) and a switching element S1C (e.g., the circuit 107). The switching element S1C may be connected to the signal V_CAL through the capacitor C1C. The switching element S1B may be connected to the voltage VCMO through the capacitor C1B. The switch 108 is shown implemented as a switching element S2B (e.g., the circuit 109) and a switching element S2C (e.g., the circuit 111). The switching element S2C is shown connected to the signal V_CAL through the capacitor C2C. The switching element S2B is shown connected to the signal VCMO through the capacitor C2B.

If there are n branches (e.g., circuit 120 +circuit 130 +...), constraints are generally A1+A2+...+AN=1 and C1+C2+...+CN=CHPF. Ratios among the values A1, A2, ..., AN are A2=a*A1, A3=B*A2, ..., AN=y*A(N+1) and can have different values, that is, where a can equal or not equal to B, ..., Δcan equal or not equal to y. At the same time, a (FET channel) W/L ratio of the switches in different branches should change accordingly. For simplicity, a=B=...=y=0.5 is used in the examples.

Figure 2:
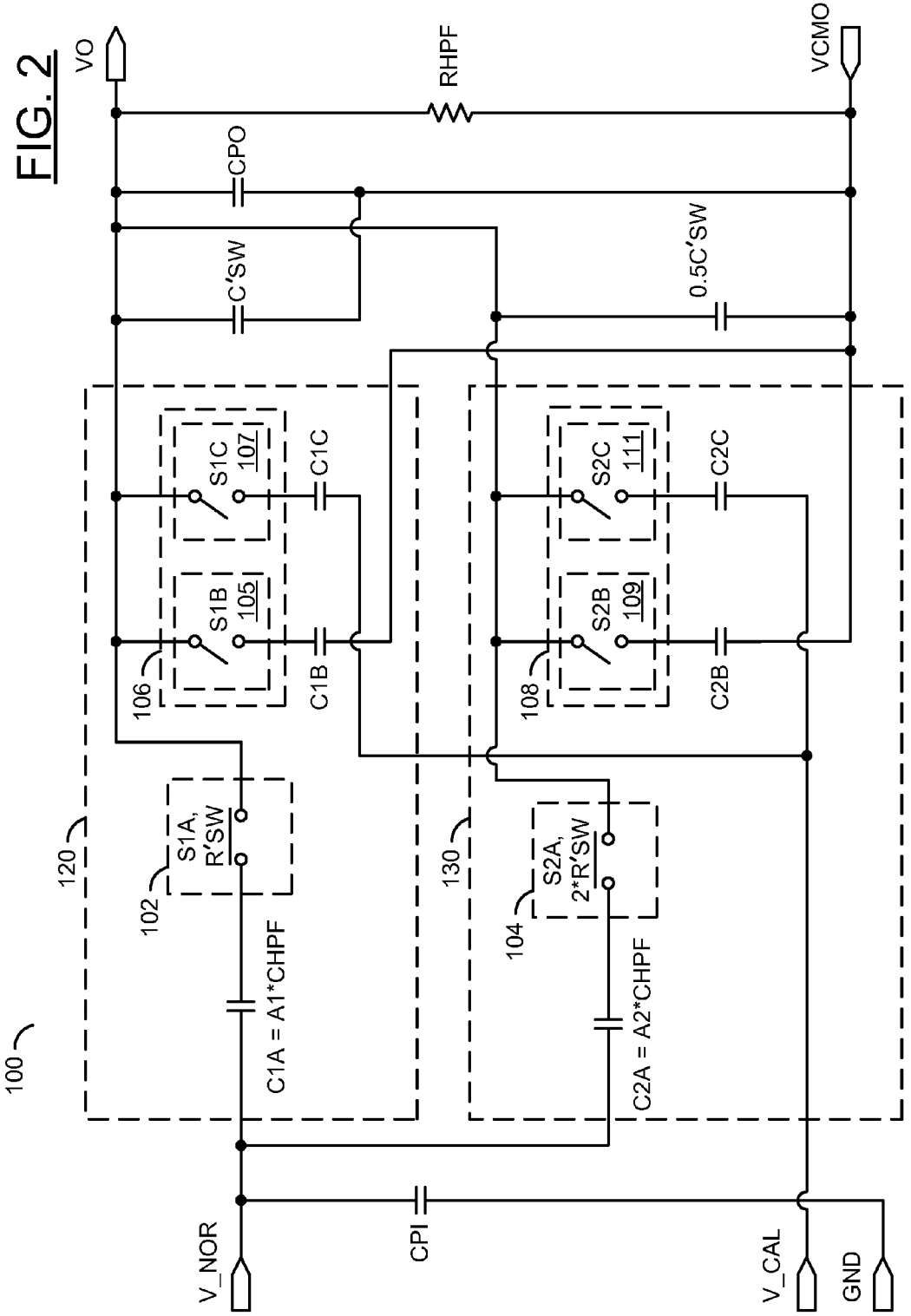
FIG. 2 is a diagram of the single-ended coupling circuit with parasitic capacitances.

Referring to FIG. 2, a diagram of the circuit 100 with parasitic capacitances is shown. A capacitor (e.g., CPI) is shown representing the input parasitic capacitance seen by the signal V_NOR. A capacitor (e.g., CPO) is shown representing the output parasitic capacitance at the node VO. Parasitic capacitances caused by the switches 102 and 106 are shown represented by a capacitor (e.g., C'SW). Parasitic capacitances caused by the switches 104 and 108 are shown represented by a capacitor (e.g., 0.5C'SW). A resistance (e.g., R'SW) is shown representing a parasitic resistance of the closed switch 102. A resistance (e.g., 2*R'SW) is shown representing a parasitic resistance of the closed switch 104.

The capacitor CPI is the input parasitic capacitance from pads, package, electro-static discharge diodes and wiring. The capacitor CPO is the output parasitic capacitance from the resistor RHPF, the wiring and the loading circuit. The capacitor value CSW=C'SW+0.5*C'SW=1.5*C'SW is the total parasitic capacitance of switches.

Consider an AC response where CPI1=CPI, CPO1=CPO+CSW, an attenuation (or gain) of G1=VO/V_NOR in flat band is given by formulae 1a and 1b as follows:

$$G1 = \frac{RHPF \times CHPF}{RSW \times CHPF + RHPF \times (CHPF + CPO1)} \quad (1a)$$

$$CPO1 = CPO + CSW \quad (1b)$$

The high pass filter time constant tau is given by formula 2 as follows:

$$\tau 1 = RSW \times CHPF + RHPF \times (CHPF + CPO1) \quad (2)$$

If matching and termination resistors are included for a transmission line coupled to the input port, the input pole is given by formulae 3a and 3b as follows:

$$\omega IN1 = \frac{2}{Rt \times \left[\frac{CHPF \times CPO1}{CHPF + CPO1} + CPI1\right]} \quad (3a)$$

$$CPI1 = CPI \quad (3b)$$

The value of Rt is a combination of the matching and the termination resistors. The capacitance area per capacitor bank (e.g., sum of capacitances in all n branches) is generally 3*CHPF when the total switch count per channel is three (3).

From formula 3a, C'SW does not affect the input pole, but shows up in formulae 1a, 1b and 2 so the attenuation and time constant in the circuit 100 are affected by C'SW. The circuit 100 has an input pole higher than common designs. The circuit 100 also has a capacitor area that supports constant high pass filter tau at different attenuations. For example, consider a case where the attenuation of the circuit 100 is changed by opening the switch S2A and closing the switch S2B in FIG. 2. The removal of the capacitor C2A due to the open switch S2A would be matched by the addition of capacitor C2B due to the closed switch S2B in setting the high pass filter tau. Since the constraints A1+A2+...+AN=1 and C1+C2+...+CN=CHPF apply in either mode, the total capacitance remains constant at CHPF and so the high pass filter time constant tau remains constant at the different attenuations (see formula 2).

Figure 3:
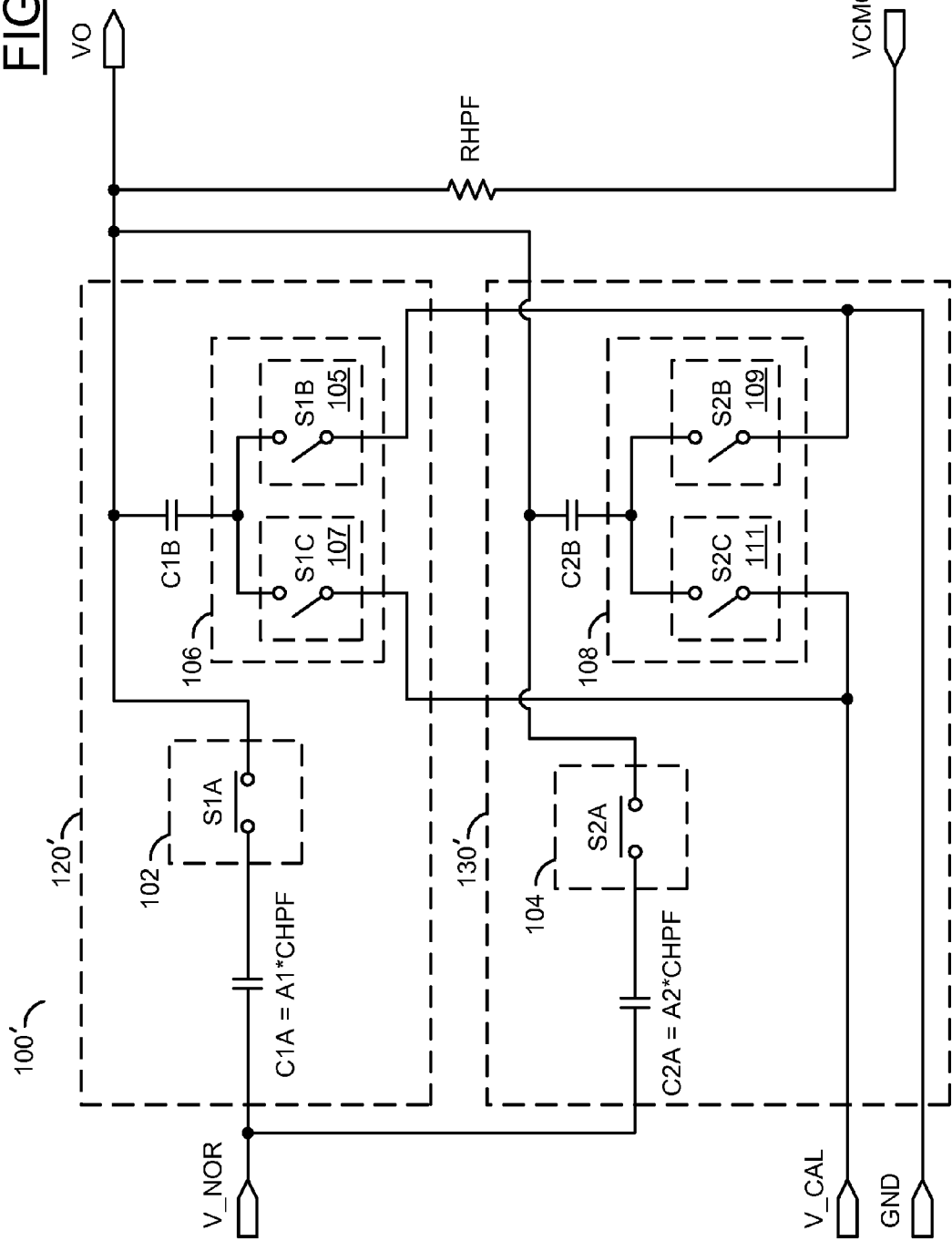
FIG. 3 is a diagram of a single-ended hybrid coupling circuit.

Referring to FIG. 3, a diagram of a circuit 100' is shown. The circuit 100' may be implemented as a single-ended hybrid AC coupling circuit. The circuit 100' generally comprises the circuit 102, the circuit 104, the circuit 106 and the circuit 108. The circuit 100' includes the capacitor C1A, the capacitor C2A, the capacitor C1B, the capacitor C2B and the resistor RHPF. The output node VO may be connected to the switch 102 and/or the switch 104. The input signal V_NOR may be presented to the output node VO through the switch 102 and/or the switch 104. The signal V_CAL may be presented to one side of the switch 106 and to one side of the switch 108. A ground voltage (e.g., GND) may be presented to one side of the switch 106 and to one side of the switch 108. In some embodiments, the circuit 100' may be duplicated to form a differential (or double-sided) AC coupling circuit.

The circuits 102 and 106 may be combined to form a branch (or channel) 120'. The branch 120' generally provides a signal path between the input node for the signal V_NOR to the output node VO. The branch 120' includes an interface that connects to the signal V_CAL. The branch 120' also includes an interface that connects to the ground voltage GND.

The circuits 104 and 108 may be combined to form a branch (or channel) 130'. The branch 130' generally provides a signal path between the input node for the signal V_NOR to the output node VO. The branch 130' includes an interface that connects to the signal V_CAL. The branch 130' also includes an interface that connects to the ground voltage GND.

To facilitate calibration, the two or more signal input paths with different input common mode voltages may be implemented. One signal path is shown as a normal operation path that receives the signal V_NOR and has the common mode voltage. The other signal path is shown as a calibration path and receives the signal V_CAL with common mode near GND (e.g., a calibration mode). To support a large input swing, the capacitors C1A and C1B are shown connected to the two signal paths. The switch 102 may be implemented as a switching element S1A. The switch 104 may be implemented as a switching element S2A. While a single switch is shown, a compound switch may be implemented to meet the design criteria of a particular implementation. The switch 106 is shown implemented as a switching element S1B (e.g., the circuit 105) and a switching element S1C (e.g., the circuit 107). The switching element S1C may be connected to the signal V_CAL. The switching element S1B may be connected to the voltage GND. The switch 108 is shown implemented as a switching element S2C (e.g., the circuit 111) and a switching element S2B (e.g., the circuit 109). The switching element S2C is shown connected to the signal V_CAL. The switching element S2B is shown connected to the voltage GND.

The capacitor C1A and C2A are shown implemented along with the switches S1A and S2A. The capacitor C1B and the capacitor C2B are shown in the AC signal path of the signals V_CAL and GND. The capacitors C1B and C2B are shown switched in or out to provide different attenuation to the active circuitry. The switch elements S1C and S1B are shown on the input side. Without the additional circuitry of the circuit 100', the switches 102 and 104 tend to introduce parasitic capacitance to the input signal V_NOR, which tends to degrade the input pole performance. In one example, the switches 102 and 104 are directly connected to the output node VO. Such an implementation will tend to introduce parasitic capacitance to the output node, which in turn may degrade the attenuation and the high pass filter time constant tau. The three design specifications—input pole, attenuation, and time constant are not compromised.

To mitigate correlation between design specifications, the switches 102, 104, 106 and/or 108 may be implemented as hybrid switches. In one embodiment, the circuit 100' implements the switches 106 and/or 108 on the input side when in a calibration mode, and the switches 102 and/or 104 on the output side when in a normal mode. To reduce the capacitor area relative to the circuit 100, the hybrid switches may be used in different branches in the circuit 100'.

Figure 4:
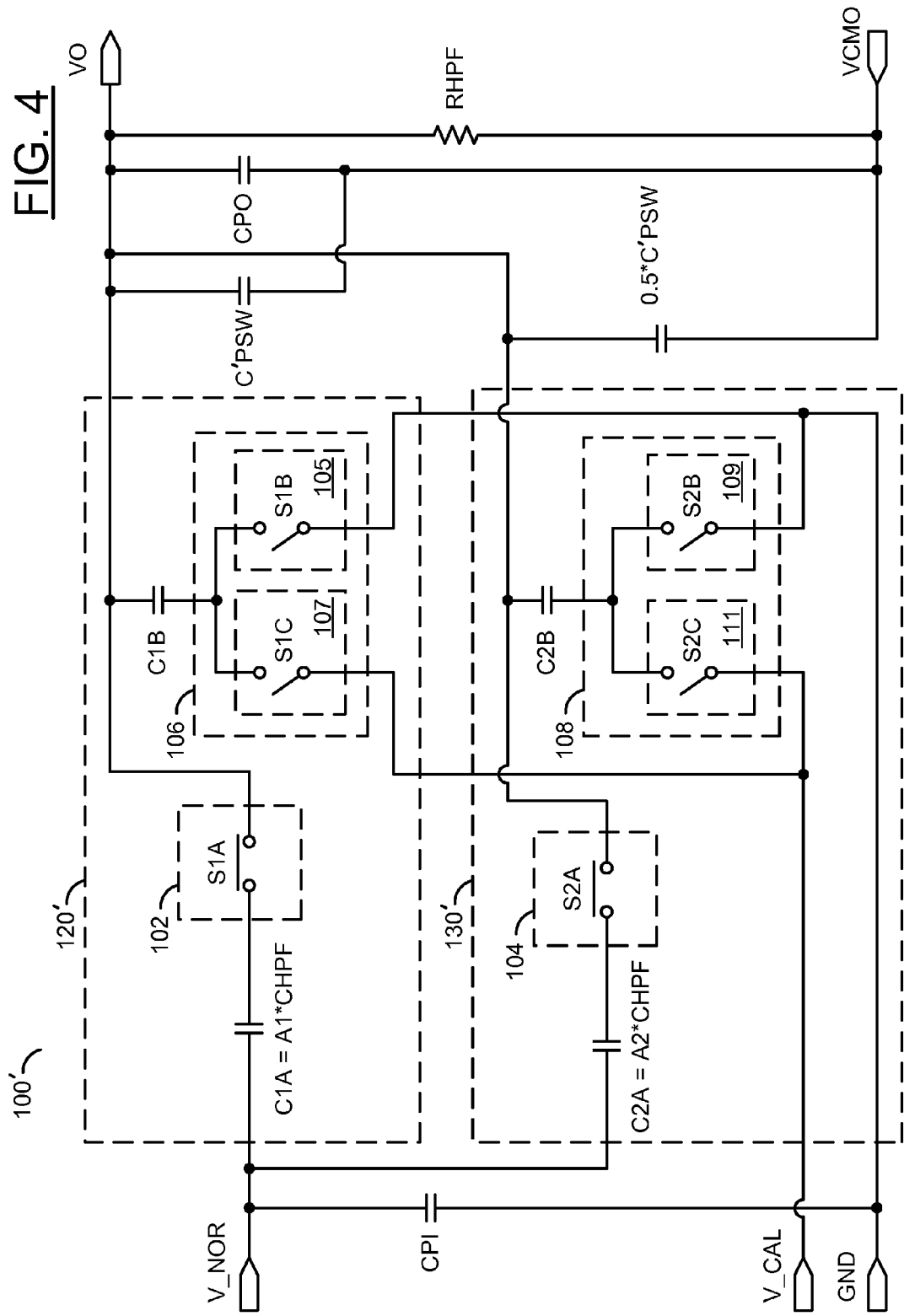
FIG. 4 is a diagram of a simplified single-ended hybrid coupling circuit with parasitic capacitances.

Referring to FIG. 4, a diagram of the circuit 100' with parasitic capacitances is shown. A capacitor (e.g., C'PSW), the capacitor CPI, the capacitor CPO, and a capacitor (e.g., 0.5*C'PSW) are shown. The capacitor C'PSW generally represents a parasitic capacitance looking into a source or a drain of the (CMOS) switch in the on state from the most significant bit path. The capacitor C'SW=(1+1/4+1/4)*C'PSW= 1.5*C'PSW is the total parasitic capacitance of switches from the most significant bit path, including switches in either the on and off state.

Consider an AC response where CPI2=CPI and CPO2=CPO+CPSW, an attenuation (or gain) of G2=VO/V_NOR in flat band is given by formulae 4a and 4b as follows:

$$G2 = \frac{RHPF \times CHPF}{RSW \times CHPF + RHPF(CHPF + CPO2)} \quad (4a)$$

$$CPO2 = CPO + CPSW, CPSW \approx 1.5 C'PSW \quad (4b)$$

The high pass frequency time constant tau is given by formula 5 as follows:

$$\tau 2 = RSW \times CHPF + RHPF \times (CHPF + CPO2) \quad (5)$$

If matching and termination resistors are included, the input pole is given by formulae 6a and 6b as follows:

$$\omega IN2 = \frac{2}{Rt \times \left[\frac{CHPF \times CPO2}{CHPF + CPO2} + CPI2\right]} \quad (6a)$$

$$CPI2 = CPI \quad (6b)$$

The capacitance area per capacitor bank is generally 2*CHPF. The total switch count per channel is 3.

Comparing the formulae 6a and 6b with the formulae 3a and 3b, the circuit 100' has a similar input pole performance as the circuit 100, and better pole performance than some common approaches. Using the structure of the circuit 100', the capacitance CPSW will not show on the input node in normal mode. Because CPO2=CPO+CPSW<CPO1=CPO+ CSW, the attenuation and time constant of the circuit 100' is less than some common approaches.

Some embodiments provide the circuit 100' with hybrid switches designed to provide flexibility in performance compromises between the input pole, the attenuation, the high pass filter time constant and the capacitor area. The circuit 100' has selectable branches (e.g., 120' and 130') that can adjust attenuation based on the input signal amplitude. The circuit 100' has selectable capacitors (e.g., C1B and C2B) in different branches using CMOS switches to switch in or out capacitors between signal path and AC ground to achieve a nearly constant high pass filter time constant. The circuit 100' has multiple (e.g., two) operation modes, a normal operation mode, and a calibration mode to set control bits of the circuit 100' in advance before normal operation. Some switches (e.g., 106 and 108) in the signal path can be directly connected to the input node in calibration mode, and other switches (e.g., 102 and 104) may be directly connected to output node VO in the normal mode. The hybrid switches can be used in different capacitor branches.

The switches that control the high pass filter capacitors in normal mode are directly connected to the output node VO. While in the calibration operation mode, some switches are on the input side, resulting in a hybrid switches connection between the different modes. Using the hybrid switches configuration, input parasitic capacitance is less than that in common designs. Therefore, compromises may be made between different specifications, like the input pole, the attenuation, the time constant and the capacitor area.

Figure 5:
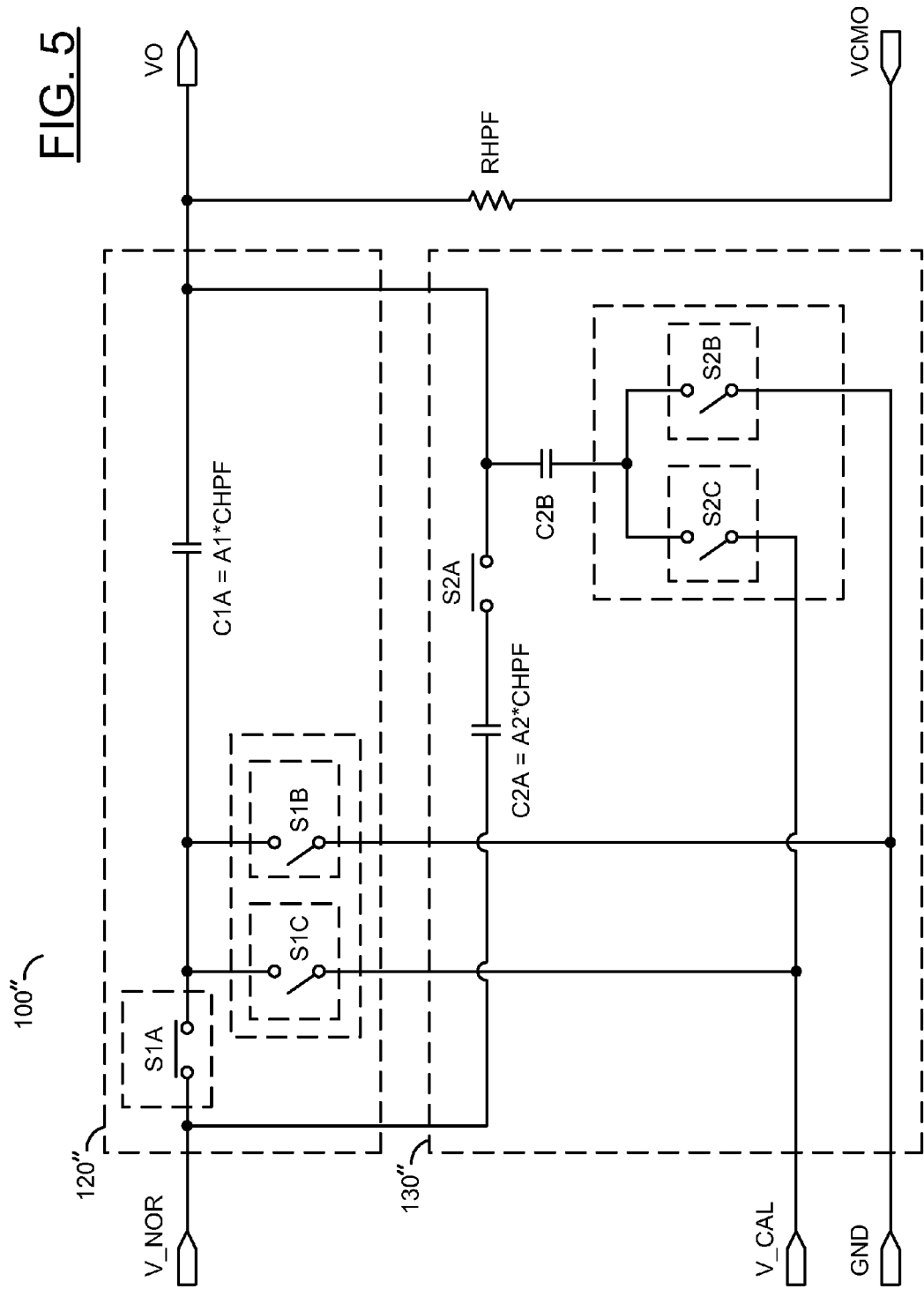
FIG. 5 is a diagram of a single-ended advance hybrid coupling circuit.

Referring to FIG. 5, a diagram of a circuit 100" is shown. The circuit 100" generally implements a single-ended advance hybrid coupling circuit. To further reduce the capacitor area, the hybrid switches are shown adopted in different branches. The circuit 100" generally comprises the switch S1A, the switch S2A, the switch S1C, the switch S1B, the switch S2C and the switch S2B. The circuit 100" includes the capacitor C1A, the capacitor C2A, the capacitor C2B and the resistor RHPF. The output node VO may be connected to the switch S2A. The input signal V_NOR may be presented to the output node VO through the switch S1A and/or the switch S2A. The signal V_CAL may be presented to one side of the switch S1C and to one side of the switch S2C. The ground voltage GND may be presented to one side of the switch S1B and to one side of the switch S2B. In some embodiments, the circuit 100" may be duplicated to form a differential (or double-sided) AC coupling circuit.

The switches S1A, S1B and S1C may be combined to form a branch (or channel) 120". The branch 120" generally provides a signal path between the input node for the signal V_NOR to the output node VO. The branch 120" includes an interface that connects to the signal V_CAL. The branch 120″ also includes an interface that connect to the ground voltage GND.

The switches S2A, S2B and S2C may be combined to form a branch (or channel) 130″. The branch 130″ generally provides a signal path between the input node for the signal V_NOR to the output node VO. The branch 130″ includes an interface that connects to the signal V_CAL. The branch 130″ also includes an interface that connect to the ground voltage GND.

The switch S1A in the branch 120″ is shown connected directly to the input node of the signal V_NOR. The switch S1A is also shown with the capacitor C1A disposed between the switch S1A and the output node VO. The switch S2A in the branch 130″ is shown with the capacitor C2A disposed between the switch S2A and the input node of the signal V_NOR. The switch S2A is shown connected directly to the output node VO. The signal V_CAL is shown connected directly to the switch S1C and the switch S2C. The signal GND is shown connected directly to the switch S1B and the switch S2B.

Figure 6:
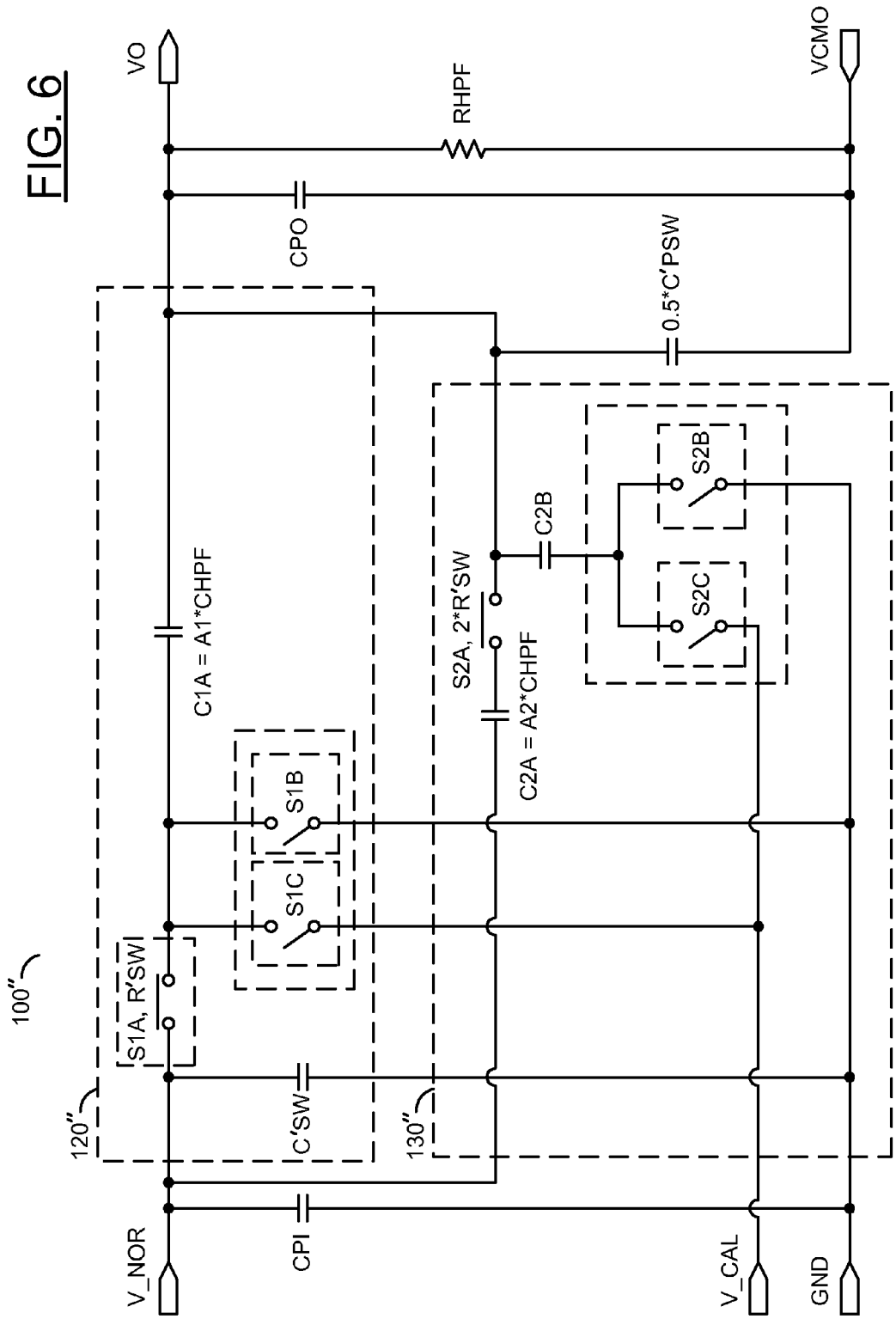
FIG. 6 is a diagram of a simplified single-ended advance hybrid coupling circuit with parasitic capacitances.

Referring to FIG. 6, a design of the circuit 100″ together with parasitic capacitances is shown. In the channel 120″, the parasitic capacitance C'SW caused by the switch S1A is added to the input node so that CIP3=CPI+C'SW. In the channel 130″, the switches S2A, S2B and S2C are connected in the hybrid way. The parasitic capacitances of the switches S2A, S2B and S2C are represented as the capacitor 0.5*C'PSW added to the output node VO so that CPO3=CPO+0.5*C'PSW. Part of the overall parasitic switch capacitance CPSW is shown on either the input side or on the output node to allow for subtle compromises between the input pole, the attenuation and the time constant. Also, the total capacitance in the signal path is Ct=A1*CHPF+2*A2*CHPF=(1+A2)*CHPF<2*CHPF (e.g., A1+A2=1 for only two branches). Then the capacitor area can be further reduced to lower than 2*CHPF.

Consider an AC response where CPI3=CPI+C'SW and CPO3=CPO+0.5*C'PSW, an attenuation (or gain) of G3=VO/V_NOR in flat band is given by formulae 7a and 7b as follows:

$$G3 = \frac{RHPF \times CHPF}{RSW \times CHPF + RHPF(CHPF + CPO3)} \quad (7a)$$

$$CPO3 = CPO + 0.5C'PSW \quad (7b)$$

The high pass filter time constant tau is given by formula 8 as follows:

$$\tau 3 = RSW \times CHPF + RHPF \times (CHPF + CPO3) \quad (8)$$

If the matching and termination resistors are included, the input pole is given by formulae 9a and 9b as follows:

$$\omega IN1 = \frac{2}{Rt \times \left[\frac{CHPF \times CPO3}{CHPF + CPO3} + CPI3\right]} \quad (9a)$$

$$CPI3 = CPI + C'SW \quad (9b)$$

The capacitance area per capacitor bank is generally (1+B)*CHPF, wherein 0 <B<1 when the total switch count per channel is three (3).

The following TABLE 1 shows the performance summarization and comparison of the circuit 100, the circuit 100′ and the circuit 100″. Per TABLE 1, to keep the input pole wide, the circuit 100 or the circuit 100′ is implemented; to keep the attenuation, the input pole, the high pass filter time constant and the capacitor area in a subtle balance, the circuit 100″ is implemented. Overall, a tradeoff among the input pole with attenuation, time constant and capacitor area, makes the designs flexible.

TABLE 1

| ACC Type | CPI/CPO | Attenuation | Time Constant | Input Pole | Cap Area | Flexibility |
|---|---|---|---|---|---|---|
| 100 | CPI1 = CPI<br>CPO1 = CPO + CSW | Worst | Worst | Highest | Largest | No |
| 100′ | CPI2 = CPI<br>CPO2 = CPO + CPSW | Moderate | Moderate | Highest | Moderate | Yes |
| 100″ | CPI3 = CPI + C'SW<br>CPO3 = CPO + 0.5*C' PSW | Better | Better | Moderate | Better | Yes |

Figure 7:
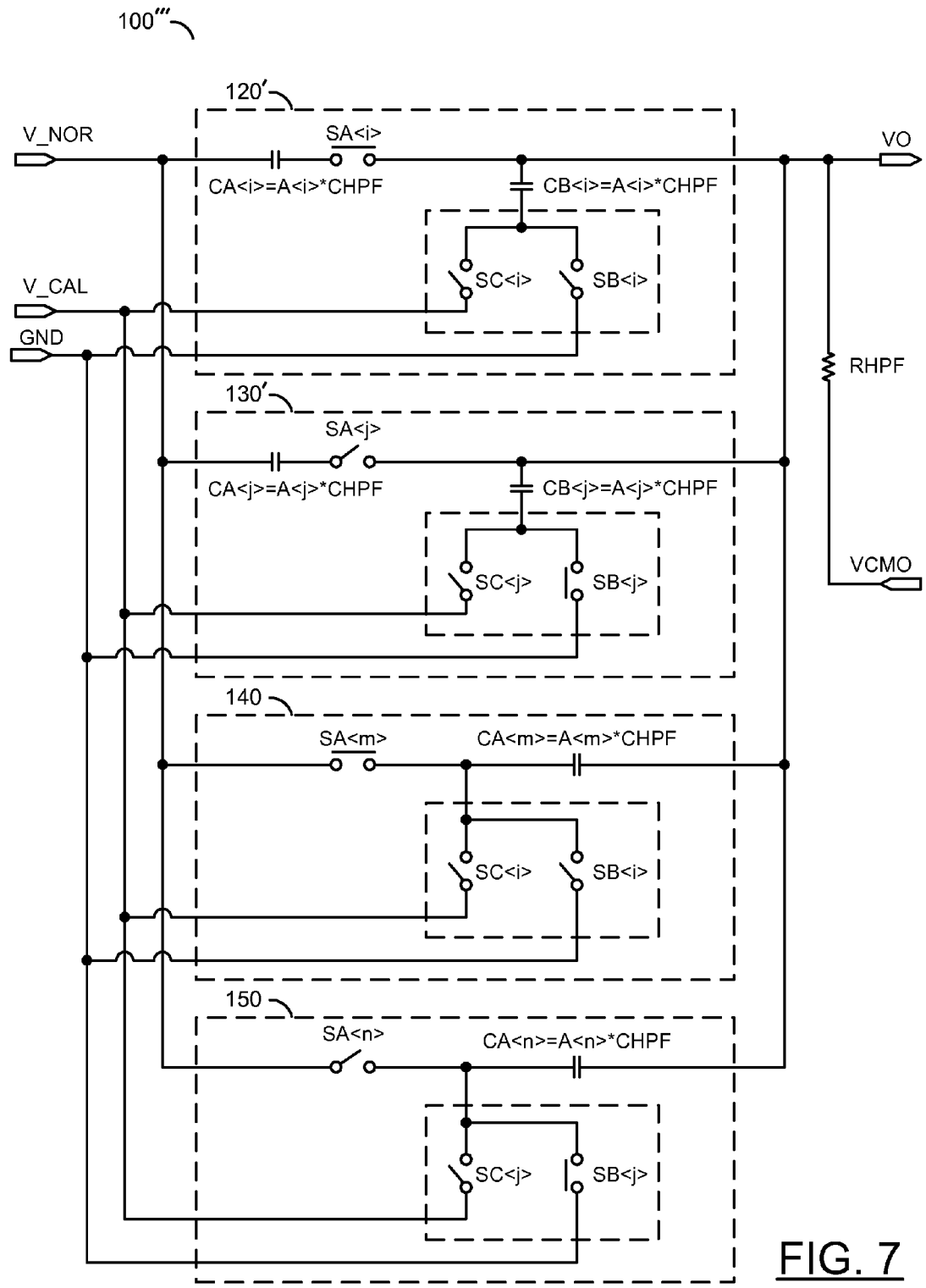
FIG. 7 is a diagram of a single-ended hybrid coupling circuit with more branches.

Referring to FIG. 7, a diagram of a circuit 100′″ is shown. The circuit 100′″ is shown implementing a single-ended hybrid coupling circuit. The circuit 100′″ generally comprises the circuit 120′, the circuit 130′, a block (or circuit 140) and a block (or circuit) 150. The circuit 120′, the circuit 130′, the circuit 140 and the circuit 150 are connected in parallel to the output node VO and the signals V_NOR, V_CAL and GND. Each circuit 140 and 150 implements a branch circuit similar to the circuits 120″ and 130″ (FIG. 5).

Figure 8:
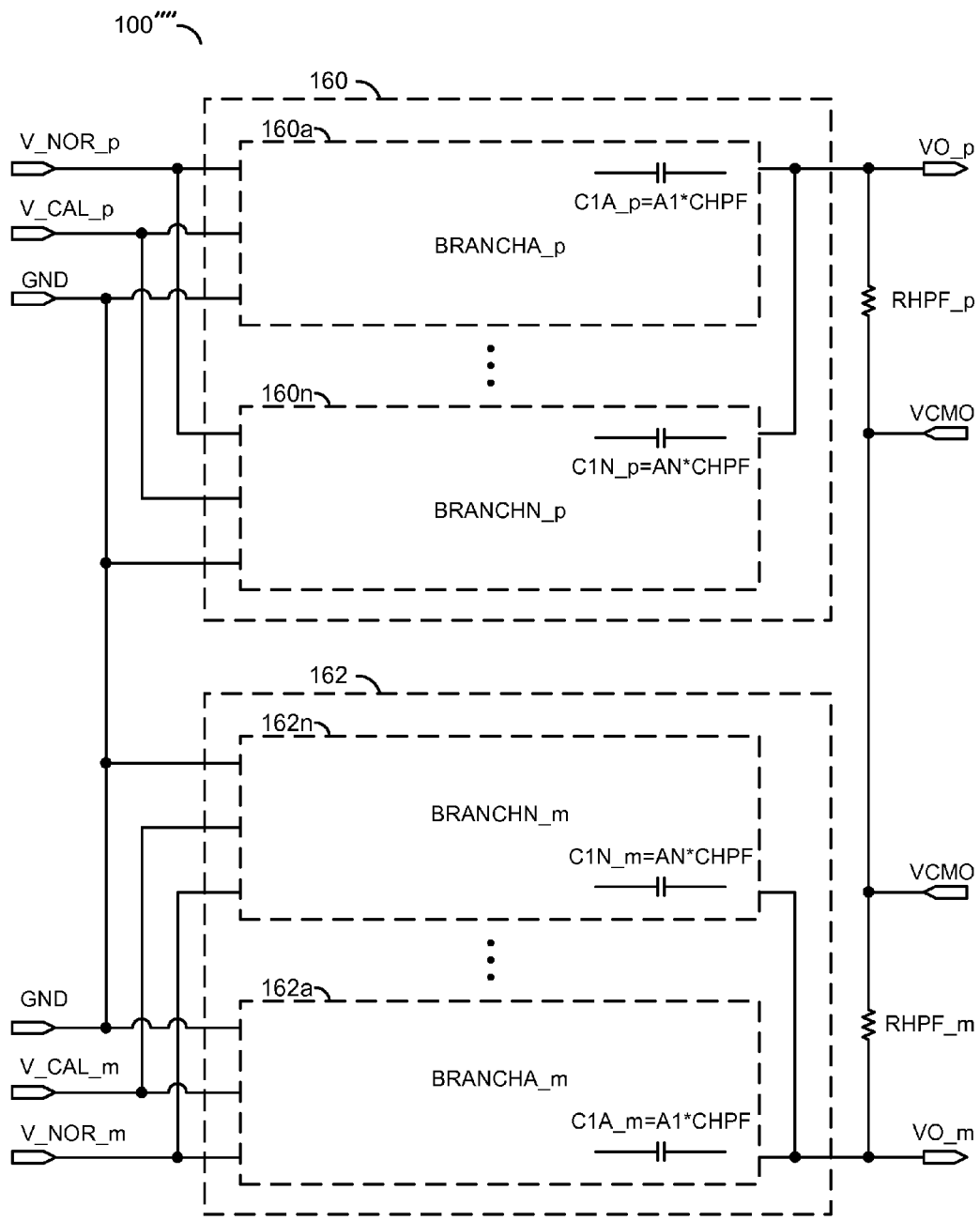
FIG. 8 is a diagram of a differential hybrid coupling circuit.

Referring to FIG. 8 a diagram of a circuit 100″″ is shown. The circuit 100″″ is shown implementing a differential (or double-ended) coupling circuit. The signal V_NOR is shown as a differential pair of signals V_NOR_p (e.g., V_NOR plus) and V_NOR_m (e.g., V_NOR minus). Likewise, the signal V_CAL is shown as a differential pair of signals V_CAL_p and VCAL_m. The node VO is shown as a pair of nodes VO_p and VO_m. The resistor RHPF is shown as a pair of resistors RHPF_p and RHPF_m. The capacitors C1A to C1N are shown as pairs of capacitors C1A_p and C1A m to C1N_p and C1N_m. A "plus" side 160 of the circuit 100″″ generally comprises multiple branches 160a-160n. A "minus" side 162 of the circuit 100″″ generally comprises multiple branches 162a-162n. The branches 160a-160n and 162a-162n may be representative of any of the other branches. The sides 160 and 162 are shown joined at the signals GND and VCMO. The relationships of the coefficients A1 to AN is generally A<i>+A<j>=X, A<m>+A<n>=Y and X+Y=1.

The various AC coupling circuit implementations generally utilize the following principles. Various tradeoffs are provided. For example, a tradeoff exists between whether to switch (and/or connect/disconnect) capacitors on the output node or whether to switch (and/or connect/disconnect) capacitors on other than the output node (e.g., on V_CAL or GND sides). If the switches for capacitors are on other than the output node (note that the output node is the "final destination" of the signal flow for the AC coupling circuit), switching capacitors on other than the output node allow for more reuse of the capacitors, since the same capacitors of a capacitor array can be switched between different nodes (e.g., V_NOR/V_CAL/GND). As a result, the total amount of capacitance (and chip area) can be conserved (e.g., not implement multiple copies of the capacitors to individually connect or not connect to/from various nodes V_NOR/V_CAL/GND). On the other side of the tradeoff, switching capacitors on other than the output node means more switches on the nodes other than the output node. Therefore, more parasitic capacitance exists on the nodes other than the output node, and no parasitic capacitance (due to the switches) on the output node.

If the switches for the capacitors are on the output node instead, no reuse of the capacitors is done. If the switches are only on the output node, a given capacitor can be connected or disconnected to the output node. The given capacitor cannot be switched to different nodes. Hence, a unique capacitor is instantiated for each node (V_NOR/V_CAL/GND) to have the option to connect a capacitor from that node to the output node. Correspondingly, no switches now exist on the nodes other than the output node, and therefore the nodes are less influenced by switch parasitic capacitance. By the same token, the output node is influenced by parasitic capacitances due to the switches.

Further tradeoffs follow regarding the following metrics, depending on whether switches are placed on the output node or on nodes other than the output node. Attenuation: the more parasitic capacitance to (AC) ground on the output node, the more attenuation is affected. On the other hand, parasitic capacitance on other nodes does not affect attenuation from the input node to the output node. ACC Time Constant: the more parasitic capacitance to (AC) ground on the output node, the more the ACC time constant is affected. On the other hand, parasitic capacitance on other nodes does not affect the time constant. Input pole: the more parasitic capacitance on the input node, the more the value of the input pole frequency is degraded (lowered). A similar comment applies for pole frequency of the V_CAL pole frequency. On the other hand, parasitic capacitance on the output node does not affect the input pole as much. Capacitance area: the more switches are used on other than the output node, the more reuse is available for the same capacitors, switching the capacitors to different connections, therefore not consuming as much capacitance and area in the design. Correspondingly, the more switches are used on the output node, the less reuse is achieved, and therefore the more capacitance and area is utilized in the design. Flexibility: the various approaches described (e.g., circuits 100, 100', 100", 100"' and 100"") allow for different tradeoffs between the metrics, depending on different strategies of which capacitors are switched (or not switched) on the output node. Other combinations/possibilities of how choosing which/what portion of capacitors are switched on which nodes that still follow the same principles may be implemented to meet the criteria of a particular application. Binary weighted arrays: each capacitor can actually be implemented using binary weighted arrays of capacitances and switches. As a result, each capacitor (and associated switches) in the array is connected/connected as appropriate to achieve certain specified effective capacitance value for the capacitors. Binary weighted arrays, in general, are a method for being able to digitally adjust capacitance value.

Assuming each capacitor is implemented via an array of capacitors, an added option in implementing any of the above configurations (actually, in particular for the circuit 100"' configuration) is to decide which capacitors of the array to switch on the output side, and which to switch on other than the output side. Therefore, potentially even more flexibility on the amounts of parasitic switch capacitances on output vs. other nodes may be realized.

Scaling switches: in order to maintain a fairly constant RC constant for each individual portion of a capacitor array, the switch size associated with each capacitor in the array can be scaled/sized accordingly. Namely, for example, smaller (narrower) switches can be used for the smaller capacitors in the array.

Adjusting tau: the high pass filter time constant tau is changed by adjusting the value of the RHPF resistor. As an option, the total amount of capacitance may be adjusted in use for a given configuration (e.g., circuits 100, 100', 100", 100"' and 100"").

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. A coupling apparatus comprising:
a plurality of branches each configured to couple at least one of (i) a first input node and (ii) a second input node to a first output node through a plurality of switches and a plurality of capacitors; and
a resistive element that connects said first output node to a second output node, wherein said first output node is loaded by at least one respective parasitic capacitance of at least one switch of said plurality of switches, and wherein said respective parasitic capacitance of said at least one switch of said plurality of switches forms a high pass filter with said resistive element between said first output node and said second output node.

2. The apparatus according to claim 1, wherein the plurality of switches comprises two or more switch groups configured to connect said at least one of said first input node and said second input node respectively to said first output node or said second output node through at least one capacitor of the plurality of capacitors that corresponds to a respective branch of said plurality of branches.

3. The apparatus according to claim 1, wherein all of said respective parasitic capacitances of said plurality of switches are part of said high pass filter.

4. The apparatus according to claim 1, wherein said first input node is loaded by at least one of said respective parasitic capacitances connecting said first input node to said second input node.

5. The apparatus according to claim 1, wherein the plurality of capacitors that separate said respective parasitic capacitances from said first input node.

6. The apparatus according to claim 1, wherein the plurality of capacitors that separate (i) some of said respective parasitic capacitances from said first input node and (ii) others of said respective parasitic capacitances from said first output node.

7. The apparatus according to claim 1, wherein said respective parasitic capacitances of a first branch of said plurality of branches are larger than said respective parasitic capacitances of a second branch of said plurality of branches.

8. The apparatus according to claim 1, wherein said apparatus is implemented as one or more integrated circuits.

9. A coupling apparatus comprising:
a first branch comprising (i) a first switch group configured to connect a first input node to an output node through a first capacitor and (ii) a second switch group configured to connect a second input node to said output node through a second capacitor; and
a second branch comprising (i) a third switch group configured to connect said first input node to said output node through a third capacitor and (ii) a fourth switch group configured to connect said second input node to said output node through a fourth capacitor, wherein said output node is loaded by at least one respective parasitic capacitance of at least one of said first switch group, said second switch group, said third switch group and said fourth switch group.

10. The apparatus according to claim 9, wherein said at least one respective parasitic capacitance forms a high pass filter with a resistive element between said output node and another output node.

11. The apparatus according to claim 10, wherein all of said at least one parasitic capacitances are part of said high pass filter.

12. The apparatus according to claim 10, wherein opening said first switch group and closing said second switch group to alter an attenuation through said apparatus does not alter a time constant of said high pass filter.

13. The apparatus according to claim 9, wherein said first input node is loaded by at least one of said respective parasitic capacitances connecting said first input node to said second input node.

14. The apparatus according to claim 9, wherein said first capacitor separates each of one said at least one parasitic capacitances of said first switch group and said second switch group from said first input node.

15. The apparatus according to claim 9, wherein (i) said first capacitor separates some of said at least one parasitic capacitances from said first input node and (ii) said second capacitor separates others of said at least one parasitic capacitances from said output node.

16. The apparatus according to claim 9, wherein said at least one parasitic capacitances of said first branch are larger than said at least one parasitic capacitances of said second branch.

17. The apparatus according to claim 9, wherein said apparatus is implemented as one or more integrated circuits.

18. A coupling apparatus comprising:
a first branch configured to couple at least one of (i) a first input node and (ii) a second input node to a first output node through at least one switch of a first plurality of switches and through a first capacitor;
a second branch configured to couple at least one of (i) the first input node and (ii) the second input node to the first output node through a second capacitor and then through a second switch of a second plurality of switches; and
a resistive element that connects said first output node to a second output node, wherein said first output node is loaded by a respective parasitic capacitance of at least one switch of the first plurality of switches or the second plurality of switches.

19. The apparatus according to claim 18, further comprising:
a first plurality of branches including said first branch, each branch of said first plurality of branches configured to couple at least one of (i) said first input node and (ii) said second input node to said first output node through said first plurality of switches including said at least one switch and through a first plurality of capacitors including said first capacitor;
a second plurality of branches including said second branch, each branch of said second plurality of branches configured to couple at least one of (i) said first input node and (ii) said second input node to said first output node through a second plurality of capacitors including said second capacitor and then through said second plurality of switches including said second switch, wherein at least one switch of said first plurality of branches or said second plurality of branches is implemented as a hybrid switch, wherein the second input node supplies a calibration voltage, and wherein the hybrid switch is used in the calibration mode to set one or more control bits of the apparatus.

20. The apparatus according to claim 19, wherein each of said first input node, said second input node, said first output node and said second output node comprises a pair of nodes for receiving differential plus or minus signals, and wherein the resistive element comprises a plus-resistive element and a minus-resistive element for respectively connecting said plus-first output node to said plus-second output node and said minus-first output node to said minus-second output node.

* * * * *